United States Patent [19]

Ehrich

[11] Patent Number: 4,917,786

[45] Date of Patent: Apr. 17, 1990

[54] METHOD AND APPARATUS FOR EVAPORATING MATERIAL IN VACUUM

[76] Inventor: Horst Ehrich, Buchenhöfe 71, 4270 Dorsten, Fed. Rep. of Germany

[21] Appl. No.: 266,380

[22] Filed: Nov. 1, 1988

Related U.S. Application Data

[63] Continuation of Ser. No. 89,904, Aug. 24, 1987, abandoned, which is a continuation of Ser. No. 722,185, Apr. 10, 1985, abandoned.

[30] Foreign Application Priority Data

Apr. 12, 1984 [DE] Fed. Rep. of Germany ....... 3413891

[51] Int. Cl.$^4$ .......................... C23C 14/22; B05D 3/14
[52] U.S. Cl. .......................... 204/192.38; 204/298.41; 427/37; 118/723
[58] Field of Search ...................... 204/192.12, 192.15, 204/192.38, 298, 192.31, 298, 298 D; 427/38, 37; 118/718, 719, 724, 725, 726, 727, 728, 729, 730

[56] References Cited

U.S. PATENT DOCUMENTS

| 4,197,175 | 4/1980 | Moll et al. | 204/19238 |
| 4,492,845 | 1/1985 | Kljuchko et al. | 204/19238 |

FOREIGN PATENT DOCUMENTS 1,322,670  7/1973  British ........................... 204/102.38

OTHER PUBLICATIONS

A. M. Dorodnov et al., "New Anode-Vapor Vacuum Arc with Permanent Hollow Cathode", Sov. Phys. Letters 5 (8) (1979).

A. M. Dorodnov et al., "Physical Principles and Types of Technological Vacuum Plasma Devices", *Sov. Phys. Techn. Phys.* 26 (3) (1981).

Vasin et al., "Vacuum Arc with a Distributed Discharge on an Expendable Cathode", *Sov. Tech. Phys. Lett.* 5(12), (1979).

Gebaur, "Investigations to the Electrode Erosion in Vacuum in the Transition Region between the Both Typical Kinds of Vacuum Arcs", *Proc. Eighth Int. Conf. Electr. Contact Phen.* 1976, p. 183.

Klapas et al, "Anode Spot Temperatures in Vacuum Arcs", *Eleventh International Conference on Phenomena in Ionized Gases*, 1973, Praque, Czechoslovakia, Sep. 1973, p. 82.

E. Gebauer, "Phenomena at the Electrodes of an Arc Discharge in the Pressure Range $10^{-6}$ to 760 Torr", *Elektrie*, vol. 28, pp. 473–475, 1974.

Miller, "Vacuum Arc Anode Phenomena", *IEEE Transactions on Plasma Science*, vol. ps-5, No. 3, Sep. 1977, p. 181.

Kimblin, "Anode Voltage Drop and Anode Sport Formation in DC Vacuum Arcs", *J. Appl. Phys.*, vol. 40, No. 4, Mar. 1969, p. 1744.

Kutzner, "Voltage-Current Characteristics of a Diffusion Vacuum Arc", *Physics*, 104E (1981), p. 116.

H. Miller, "Vacuum Arc Anode Phenomena", IEEE Transactions on Plasma Science, Vol. PS 11, No. 2, 6/83.

*Primary Examiner*—Nam X. Nguyen
*Attorney, Agent, or Firm*—Fish & Richardson

[57] ABSTRACT

A method for evaporating materials in a vacuum chamber by heating a material to be evaporated by the impact of electrons generated in a vacuum arc discharge ignited and sustained between a cold cathode and an anode, comprises the steps of locating the cathode and the anode in a vacuum chamber, connecting the material to be evaporated to at least a part of the anode in the evaporation chamber, generating electrons for a self-sustained discharge in the cathode spots on the cold cathode-surface, bombarding the anode with electrons generated in the arc discharge to obtain on the surface of the anode a power input sufficient for the evaporation of the material, and maintaining the arc discharge essentially in the vapor of the material evaporated at the anode. An apparatus for performing the method includes a vacuum evaporation chamber, in which the cold cathode and the anode, both provided with cooling means are positioned opposite to each other and the material to be evaporated is provided at the end of the anode, facing the cathode.

23 Claims, 4 Drawing Sheets

METHOD AND APPARATUS FOR EVAPORATING MATERIAL IN VACUUM

This is a continuation, of application Ser. No. 089,904, filed Aug. 24, 1987, which in turn is a continuation of application Ser. No. 722,185 filed Apr. 10, 1985 both abandoned.

FIELD OF THE INVENTION

Generally, the invention relates to a method and apparatus for evaporating materials in vacuum or at low pressure by heating the material to be evaporated due to the impact of electrons generated in a vacuum arc discharge.

BACKGROUND OF THE INVENTION

For the evaporation of material in vacuum or at low gas pressure several methods are known. Especially, these methods are used widely for the coating of surfaces. For this purpose a vapor source is located in a vacuum chamber and a substrate to be coated is located at some distance from the vapor source. The coatings are obtained by the deposition of vapor on the desired surface of a substrate. Well known are devices in which a material to be evaporated is placed in a refractory crucible. This can be heated up in different ways, e.g. by the Joule-effect or induction.

Another known method is based on the sputtering of cathodes.

For the evaporation of material by means of the impact of electrons, electron beam evaporators with hot filament cathodes are widely used. In such devices, the power density required for sufficient evaporation is obtained by accelerating and focussing electrons emitted from a hot filament onto a small surface area of the material to be evaporated. Frequently this electron beam is forced on a curved path by the action of a magnetic field. A disadvantage of this method is a rather low current (e.g. 1 A) and high energy of electrons (e.g. 10 keV) as well. Due to these facts nearly no reaction between electrons and residual gas or material vapor occurs in the evaporator. However, a reaction of electrons with the residual gas or vapor (leading to dissociation, excitation, and ionisation) is highly desirable in order to obtain coatings of higher quality. Also, to prevent sparking in the electron gun and to prevent destruction of the hot filament cathode the gas pressure must be maintained below $10^{-4}$ mb.

To eliminate these disadvantages electron beam evaporators, based on hollow cathode discharges with hot and cold cathodes, have been developed as disclosed by C. T. Wan, D. L. Chambers and D. C. Carmichael in "Journ. of Vacuum Science and Technology", Vol. 8, N. 8, p. VM99, 1971. In contrast to the electron beam evaporators described above these devices can be operated at pressures above $10^{-4}$ mb. However, only the hot hollow cathode provides a desired current voltage characteristic. There are still serious disadvantages which reside in that the discharge is hard to ignite, the cathode material is sputtered and contaminates the coatings, and an ambient working gas atmosphere is necessary to maintain the discharge. Though an ambient gas may be useful to obtain reactive coatings, it reduces the quality of the obtained coatings in many cases. Hollow cathode evaporators are not used in industrial practice. Another known method disclosed in U.S. Pat. No. 4,197,175 is based on the bombardment of an anode with electrons from a low-voltage arc discharge. This discharge is sustained between a hot filament cathode placed in a chamber which is separated from the evaporation chamber and communicates therewith through an aperture, and an anode placed in the evaporation chamber. The material to be evaporated is connected to the anode. During operation, gas is introduced continuously into the hot cathode chamber and the gas expands into the evaporation chamber through said aperture. By pumping continuously the gas out of the evaporation chamber a pressure difference between the two chambers is maintained. Due to this mechanism the gas pressure in the hot cathode chamber is sufficiently high to sustain the arc discharge ($2.10^{-2}$ mb), while in the evaporation chamber the gas pressure is one order of magnitude lower. During operation the arc discharge burns through the mentioned aperture and is directed to the anode. In addition, the discharge constricted already by the aperture is focussed by the action of an adequate magnetic field onto a small spot of the anodic material to be evaporated. Typical values are power inputs of 5 to 8 kW onto an anode spot of about 0.2 cm². Like in the case of the hollow cathode discharges a higher activation of the evaporated material is obtained by means of the low-voltage arc. On the other hand, both discharges are sustained by an ambient working gas. Without a residual gas, no operation of the discharges is possible. For this reason, these methods are preferably used for producing reactive coatings like TiN. In order to obtain pure coatings the presence of an ambient gas is a disadvantage in many cases.

Further known is a method making use of the cathode spot evaporation in vacuum arcs. This known method is disclosed in the British Pat. No. 1,322,670. Vacuum arcs are discharges between two electrodes placed initially in a high vacuum. Normally, the discharge is sustained by the evaporation and ionisation of cathode material. Characteristic features of these discharges are the so-called cathode spots. These are, depending on the current, one or several bright and quickly moving spots on the relative cold surface of the cathode. Nearly the whole current of the discharge is concentrated in the cathode spots resulting in current densities between $10^5$ and $10^7$ A/cm². This high power-concentration leads to an intense erosion of the cathode material. The eroded material consists of ionized metal vapor as well as numerous very small molten droplets. This mechanism is closely related to the sputtering of cathode material mentioned above. Though no ambient working gas is necessary to operate this discharge, this method has two serious disadvantages: (1) This discharge is very unstable and requires either very high currents or must be reignited very often as disclosed by A. S. Gilmour Jr. and D. L. Lockwood, "Proceedings of the IEEE", Vol. 60, No 8, p. 977, 1972 and by J. D. Cobine and G. A. Farrall in "Journ. of Appl. Physics", Vol. 31, No. 12, p. 2296, 1960; and (2) The molten droplets leaving the cathode with a high speed result in pinholes covering the coated surfaces. Numerous literature publications can be found concerning the basic physics and the application of vacuum arcs. A comprehensive presentation can be found in "Vacuum arcs", Theory and Application, J. M. Laffety, Editor, John Willey a. Sons, 1980. The conventional vacuum arc is characterized by the mentioned cathode spots, i.e. bright and quickly moving spots on the relative cold surface of the cathode. In these spots the electrons and vapor to sustain the discharge are produced. Normally, this discharge is very unstable and extinguishes in fractions of seconds. Due to this property vacuum arcs have found their main application in high-current circuit-breakers. Anode phenomena leading to anodic evaporation are only known for very high currents above several thousand A (H. C. Miller, IEEE "Transaction on Plasma Science", Vol. PS-11, No 2, p. 76, 1983). It has the aim of all current technical efforts to avoid anodic evaporation, since this effect leads to a failure of a circuit breaker.

SUMMARY OF THE INVENTION

It is an object of the present invention to provide an improved method of and apparatus for evaporating materials in a vacuum chamber.

The inventive method makes use of a new type of the vacuum arc developed by the inventor, which is the anodic vacuum arc at low currents.

In the well-known vacuum arc discharges, only the cathode is active, the material and electrons necessary to sustain the arc discharge are produced in the cathode spots. The anode is inactive and only collects electrons and material from the discharge. Due to a rapid condensation of the material eroded at the cathode on the surrounding walls this type of electric arc is very unstable and normally extinguishes within a short time.

The problem underlying the present invention is to avoid the disadvantages of the methods described above and to provide an electron beam evaporation method which can be realized technically in a simple way. Also, it can be used for a great variety of applications, and ensures, at the same time, that vapor is highly activated and that the evaporation under clean vacuum conditions is as possible as the evaporation into a reactive atmosphere.

The inventive method of evaporating material in a vacuum evaporator by bombarding a material to be evaporated with electrons generated in a vacuum arc discharge sustained between a cathode and a anode placed in the vacuum evaporator is characterized in that (1) the material to be evaporated is connected to the anode,
(2) the electrons bombarding the anode are generated in a vacuum arc discharge which has its main features in bright quickly moving cathode spots on a rather cold cathode surface, and
(3) the material evaporated at the anode essentially delivers the working gas for self-sustainment of the discharge.

The basic physical background of the invention is the development of a new type of an arc discharge, the anodic vacuum arc at low currents. By proper construction of the electrodes, especially the anode, anodic evaporation stabilizes the discharge. This anodic evaporation takes place in spot-like structures at the surface of the anode. These spots are a source of a plasma jet consisting of highly ionized metal vapor. This spot formation is characteristic for this type of the discharge and appear itself without external manipulations, e.g. a magnetic field. Due to this self-focussing at the anode the power input to a small area at the anode is very high resulting in rapid evaporation and activation of the anode material. The physical reasons leading to anode spot formation have been unknown up to now.

The evaporation rate at the anode is much higher than at the cathode. Thus, this new type of an arc discharge is stable as long as the vapor production at the anode occurs, and the discharge can be maintained for a long time by proper replacement of the evaporated material. By proper constructions and dimensions of the electrodes the arc discharge can be operated between 10 and 40 A, depending on the material to be evaporated, with a voltage drop between 30 V and 40 V across the discharge. The highly activated evaporated anode material not only maintains the arc discharge but may be also used in a great variety of applications for producing metal vapor and for coating purposes.

Thus, it is suggested by the inventive method to evaporate material by connecting the material to an anode and bombarding said material with electrons generated in an anodic vacuum arc discharge, which is sustained between a cathode operating in the spot mode and an evaporating anode thereby providing a working gas for self-sustainment of the discharge. The highly activated material vapor can be used for many purposes.

A main application of the inventive method of evaporating material is the coating of surfaces in a vacuum coating plant, but the inventive method of evaporating material in a vacuum can also be applied for many other purposes, e.g. for getter-pumps and for metal-vapor lasers.

The anodic vacuum arc can be ignited in different ways. Prior to ignition the ambient gas pressure should be pumped of a value of at least $10^{-1}$ mb. If clean vacuum conditions are desired, the ignition and operation of the arc at a high or even ultra-high vacuum is advisable. Ignition of the arc discharge can be achieved by setting the arc power supply to predetermined values, and by shortly contacting the cathode and the anode. Besides this technique, all other techniques known from igniting triggered vacuum gaps can be applied successfully, e.g. a third movable electrode connected either to the anode or cathode and the injection of a plasma into the space between anode and cathode. Furthermore, the arc may be ignited in an atmosphere of sufficient pressure as a gas discharge and the transition to a vacuum arc can be achieved by pumping the gas out of the evaporation chamber. For a safe ignition, a short high current pulse at the very beginning of the discharge is advisable.

While carrying out the inventive method the evaporation rate can simply be varied by a variation of the arc current. In one and the same evaporation chamber, an evaporation from a plurality of anodes, provided with the same or different evaporative materials, is possible. In this case it is useful to separate the anodes electrically from each other by small resistors. The anodes can be operated simultaneously or alternately under uniform or different electrical conditions. The anodes can be switched on or off easily by means of individual circuit breakers. A plurality of anodes can be operated with one or several cathodes. A simultaneous vapor deposition from two or more evaporation sources may be a tool for producing alloys.

To the substrates to be coated, a variable potential, preferably negative relative to the anode, may be applied. This potential may be useful to improve the quality of the coatings in a variety of coating processes. Furthermore, the anode or the cathode of the vacuum arc can be set to an arbitrary electrical potential with respect to the wall of the evaporation chamber.

It is further useful to use the cathode of the same material as that evaporated at the anode. On the other hand, a cathode of another than that material may be covered immediately after arc ignition by the evaporated anode material. Thus, contaminations due to cathode material of the coatings obtained can occur only shortly after ignition of the arc.

While carrying out the inventive method the anode as well as the cathode can be moved with respect to the substrate being coated. This may be useful in preventing "shadows" on the substrates during the coating process.

It is further useful to surround the cathode with a proper shielding in order to avoid bombardment of the substrates being coated with molten droplets stemming from the cathode spots.

Though constructive details of the anode can be carried out in different manners, in principle the active part of the anode consists of a refractory metal supporting the material to be evaporated. Proper cooling of both electrodes, the anode and cathode, is advisable. For a long time operation a replacement of the evaporated material is necessary. This problem can be solved, for example, by using a refractory tube as part of the anode. The evaporated material is replaced by a movable wire within the tube.

By means of the inventive method a great number of material can be evaporated and can be used for coating purposes on practically all solid surfaces. The obtained coatings are homogeneous, free of pinholes and show an excellent adhesion. The deposition rates are high. For example, with aluminum at 20 A, at a distance of 30 cm, the deposition rate is about 0.1 $\mu$/s. In this case the power input to the whole arc is only 0.7 kW (20 A, 35 V). Due to a low power input and high deposition rates the thermal stress of the substrates being coated is rather low. This makes the inventive method especially useful for metallic coatings of plastics. Low thermal stress could be demonstrated by coating a wax candle with aluminum. No melting of the wax-surface could be detected after the coating process.

Besides evaporation of metals at an ambient gas pressure of preferably $10^{-4}$ mb the inventive method can also be applied for reactive coatings. To produce titanium nitride layers, for example, metallic titanium is evaporated by the inventive method in an ambient nitrogen atmosphere of $10^{-2}$ mb. The nitrogen is activated by an additional discharge within the evaporation chamber. Due to a chemical reaction between the titanium vapor and the nitrogen a gold-colored TiN-layer can be obtained on the substrates. Such layers are useful, for example, as wear-resisting coatings on surfaces exposed to strong mechanical stress.

In a special application, the inventive method can be used for coating the inner walls of tubes and bore-holes. For this application the whole anodic vacuum arc can be moved during operation within bore-holes and tubes. This can be made possible by mounting the anode as well as the cathode on a disc, which can be moved vacuum-tight within a bore-hole or tube. Two discs and the inner wall of a borehole or tube between the two discs define the evaporation chamber. The discs contain the electrical and vacuum connections.

In summary the inventive method is characterized by the following features:
  high deposition rate and low power input;
  low thermal stress of the surfaces being coated;
  the coatings obtained are homogeneous, pinhole-free and show an excellent adhesion;
  simple and economic realization;
  no external manipulations are necessary to focus electrons on an anode spot;
  the material evaporated is highly activated;
  coating processes are possible in a very high vacuum as well as in a rather high ambient atmosphere,
  small dimensions of the evaporation source, therefore high mobility; for example, the inventive method may be applied for the coating of the inner walls of tubes;
  possibility of producing alloys by simultaneous operation of different evaporation sources; and
  possibility of producing "sandwich-coatings" by successive operation of different evaporation sources.

Finally, a brief comparison of the inventive method to other known methods is given. The basic physical mechanism underlying the inventive method is the evaporation of material by means of an electron bombardment. On the other hand, however, all methods described above, including the inventive method differ in the physical mechanisms of generating the electrons bombarding the material connected to an anode. The classical electron beam evaporator makes use of electrons emitted by a hot filament cathode. These electrons are accelerated by a high voltage and bombard the anode without activating a produced vapor or residual gas. Two other methods are based on low pressure gas discharges. While one method makes use of a hot hollow cathode to generate electrons, these are generated in a hot filament cathode in the second method disclosed in the above mentioned U.S. Pat. No. 4,197,175.

In both cases a rather high gas pressure in the cathode region is necessary to multiply electrons emitted from the hot cathode by inelastic collisions between electrons and gas atoms. In this way a much higher current to the anode is produced than is possible by electron emission from hot filaments alone. To obtain a sufficient power density for evaporation of material connected to the anode, the electron beams are focussed by means of a magnetic field onto a small area on the anode. Typical operation values for the discharges are in the order of 100 V and 100 A, meaning a power input in the order of 10 kW.

While carrying out the inventive method the electrons bombarding the anode are generated in a vacuum arc discharge. Firstly, no working gas at all is needed to sustain the discharge. But, if desired, the vacuum arc discharge can be operated in an ambient gas atmosphere too. Under high vacuum conditions the anodic vacuum arc produces itself a working gas by evaporation of the anode. Secondly, the cathode consists of a compact metallic disc being practically indestructible. Thirdly, the formation of an anode spot is a fundamental feature of the anodic vacuum arc used in the inventive method. A sufficient high power concentration on the material to be evaporated is ensured by a self-focussing mechanism of the discharge on the anode. Unlike the gas discharges, no external manipulations as e.g. a magnetic field are necessary to concentrate the electron beam on the material to be evaporated. Thus, the production of a pure metal vapor plasma is possible. Fourthly, typical power inputs required for the inventive method are below 1 kW. This value is far below the values of conventional methods and reduces drastically the thermal stress of the substrates being coated. Finally, the vacuum arc used so far for coating purposes is based on the cathode spot mechanism (British Pat. No. 1,322,670); the anode is inactive. The basic cathode spot mechanism is closely related to the effect of sputtering, used for coating purposes for a long time.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DETAILED DESCRIPTION OF THE PREFERRED EMBODIMENTS

Figure 1:
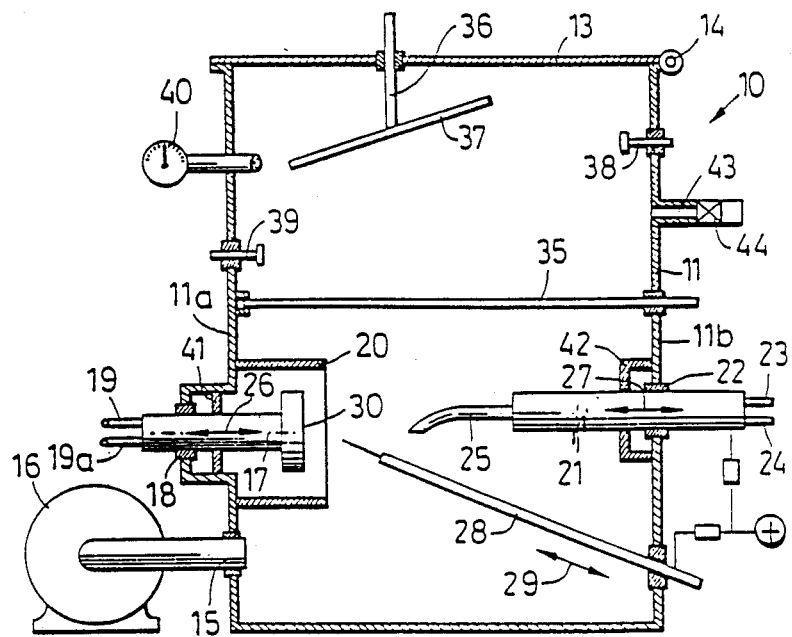
FIG. 1 is a vertical cross-sectional view of an apparatus in accordance with the invention.
Figure 2:
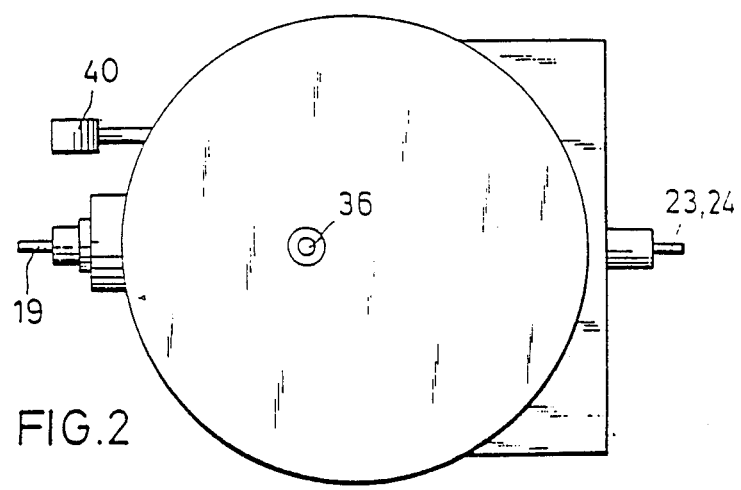
FIG. 2 is a top plan view of the apparatus in FIG. 1.

Referring now to the drawings in detail FIGS. 1 and 2 show a coating device 10 which comprises a stainless steel tube 11 closed at the bottom with a disc 12 and at the top by a cover 13 pivotable about a joint 14. The tube or vessel 11 is connected to a vacuum pumping system 16 via a tube 15. A cathode 17 is fixed to a wall 11a; the electrical insulation between wall 11a and cathode 17 is achieved by an insulator 18. The cathode can be cooled by means of coolant channels, these are connected to an input 19 and output 19a for a cooling medium. The inner end of the cathode is surrounded by a ceramic shield 20 being fixed to the wall 11a. Opposite to the cathode 17 is an anode 21 which is electrically insulated from a wall 11b by an insulator 22. Also there are input 23 and output 24 for a cooling medium. The end 25 of the anode 21 closest to the cathode 17 is made of a refractory metal to which the material to be evaporated is connected.

To ignite the vacuum arc the cathode 17 and/or the anode 21 are movable as indicated by the double arrows 26 and 27, respectively. For ignition the end 25 of the anode and a surface 30 of the cathode have to be contacted shortly. Another ignition device is also shown in FIG. 1. It consists of an auxiliary anode 28 being movable in the direction of the double arrow 29. Normally, to ignite the arc discharge, either movable electrodes 17 and/or 21 or an auxiliary electrode are necessary. Of course, instead of an auxiliary anode 28 also an auxiliary cathode can be used.

Above the electrodes 17 and 21 is a support 37 for substrates to be coated. This support can be moved by a rod 36; the arc discharge can be separated from the substrates by a shutter 35. Cleaning of the substrates prior to the coating process is possible by means of a glow-discharge between electrodes 38 and 39. A gas may be introduced into the vessel 11 by means of a valve 44 via a tube 43. Shields 41 and 42 prevent a failure of the insulators 18 and 22 due to a coating with metal. 40 is a vacuum gauge.

Figure 3:
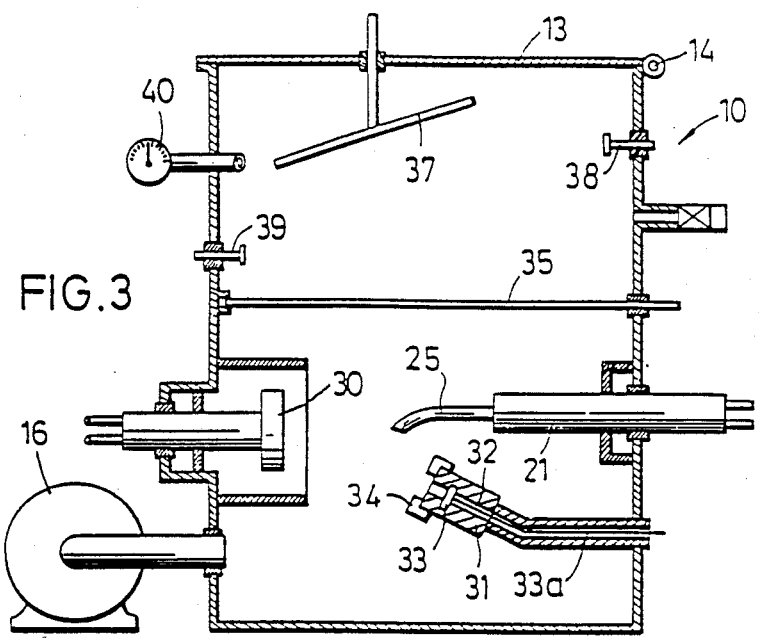
FIG. 3 is a vertical sectional view of the ignition device of another embodiment.

In FIG. 3 a method is shown to ignite the arc discharge by means of a plasma gun. The gun consists of a capillary discharge comprising a plastic disc 31 with a bore 32, an inner electrode 33 with an electrical connection 33a, and a second electrode 34. A high voltage pulse of 20 to 30 kV produces plasma inside the bore expanding through the electrode 34 into the space between the cathode surface 30 and the anode 25.

Figure 4:
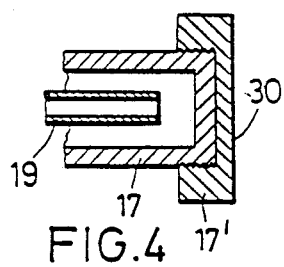
FIG. 4 is a side sectional view of the cathode.
Figure 4B:
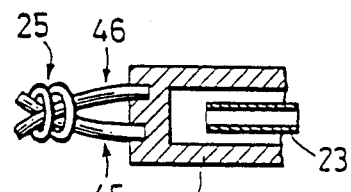
FIGS. 4A and 4B are schematic view of the anodes of the modified embodiments.
Figure 4A:
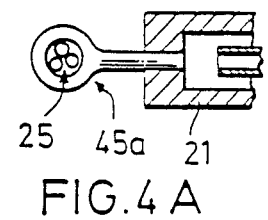

FIG. 4 shows in more detail preferred embodiments of the electrodes. Cathode 17 consists of a disc of e.g. 20 mm diameter and is mounted on a cooled support 17'. A cooled support 21' of the anode shown in FIG. 4B carries two tungsten rods 45 and 46 of 2 mm diameter. The material to be evaporated 25 is connected to the rods 45 and 46. In another construction of the anode as shown in FIG. 4A the rods 45 and 46 are replaced by a crucible 45a carrying the material to be evaporated 25. The purpose of the crossing rods 45 and 46 in FIG. 4B is to fix a droplet of the molten material to be evaporated near the crossing point.

The supports of the electrodes 17 and 21 also serve as electrical connections to a power supply suitable for operating the anodic vacuum arc.

Figure 5:
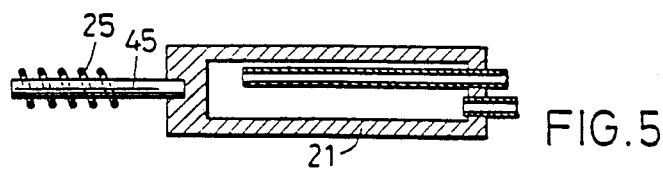
FIG. 5 is a sectional view of yet another modified embodiment of the anode.

FIG. 5 shows yet another embodiment of the anode, in which rod 45 carries thereon a helical wire of material 25.

Figure 6:
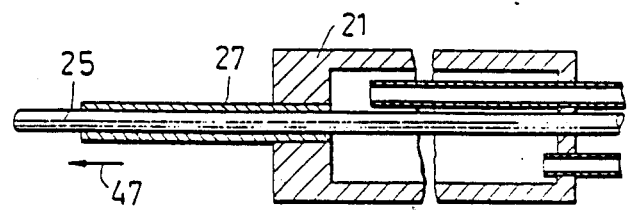
FIG. 6 is a side sectional view of still further embodiment of the anode.

In FIG. 6 the anode is shown, suitable for a long time operation of the discharge. The material 25 to be evaporated is displaced through a tube 27 in the direction of arrow 47.

Figure 7:
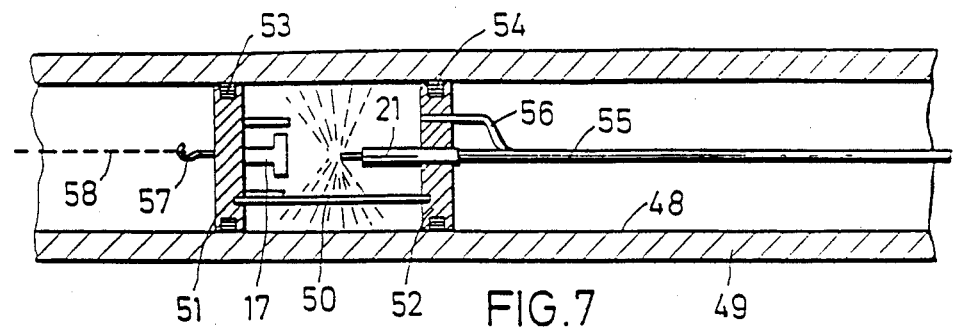
FIG. 7 is a sectional view of the apparatus in accordance with the invention suitable for coating inner walls of tubes and bore-holes.

FIG. 7 shows a device suitable for coating an inner wall 48 of a tube 49. Two discs 51 and 52 carry the electrodes 17 and 21. The discs are connected to each other by one or several rods 50 and are surrounded by seals 53 and 54. Electrical and pumping connections are made possible via lines 55, 56 and 50. The evaporation chamber is defined by the inner wall of the tube 48 between two discs 51 and 52. To coat the whole inner wall of a long tube this device can be moved along the inside of the tube by means of a cord 58 fastened to a hook 57 connected to one of the discs.

Figures 8, 9:
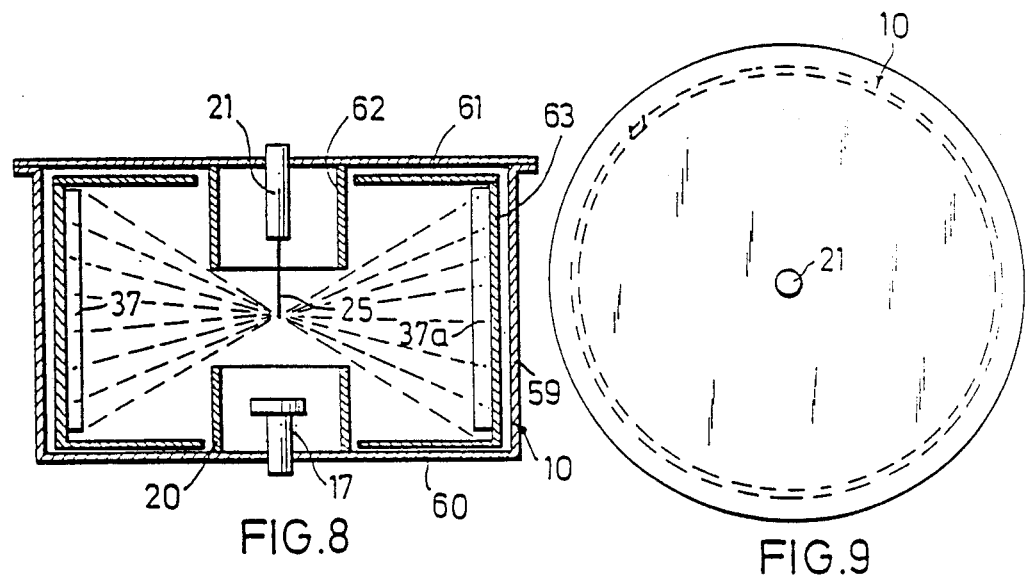
FIG. 8 is a vertical cross-sectional view of a further coating device suitable for carrying out the inventive method.
FIG. 9 is a top plan view of the apparatus in FIG. 8.

FIGS. 8 and 9 show an apparatus in accordance with the inventive method, consisting of a cylindrical box 59 with a bottom 60 and a cover 61. The cathode 17 and the shield 20 are fixed to the bottom while the anode 21 is fixed to the cover. The substrates to be coated 37, 37a, etc. are mounted on a cylindrical support 63 which can easily be placed into the evaporation chamber or removed from it.

Figure 10:
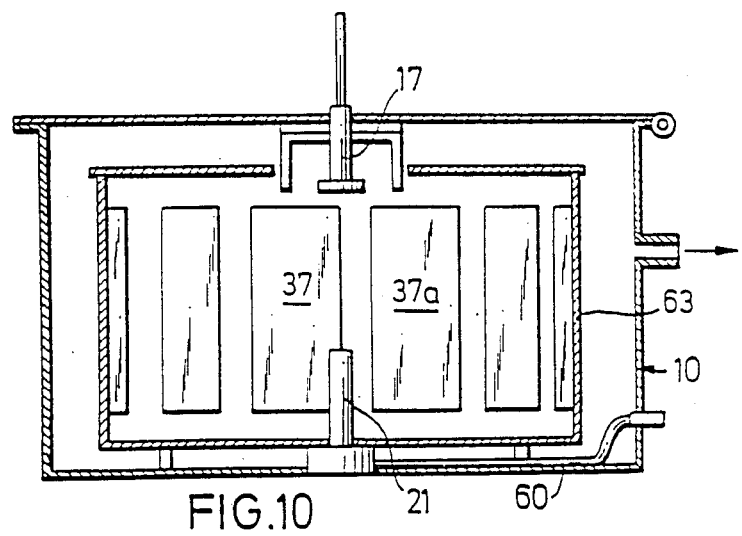
FIG. 10 is a vertical cross-sectional view of still a further coating apparatus suitable for carrying out the inventive method.

FIG. 10 shows a similar embodiment for performing the inventive method with the exception, that the anode 21 is fixed to the bottom and the cathode 17 is fixed to the cover. The substrates to be coated 37, 37a, etc. are positioned inside the plastic support 63. This support 63 may be replaced after some time and serves to prevent the evaporation chamber 10 from being coated with the evaporated materials.

Figure 11:
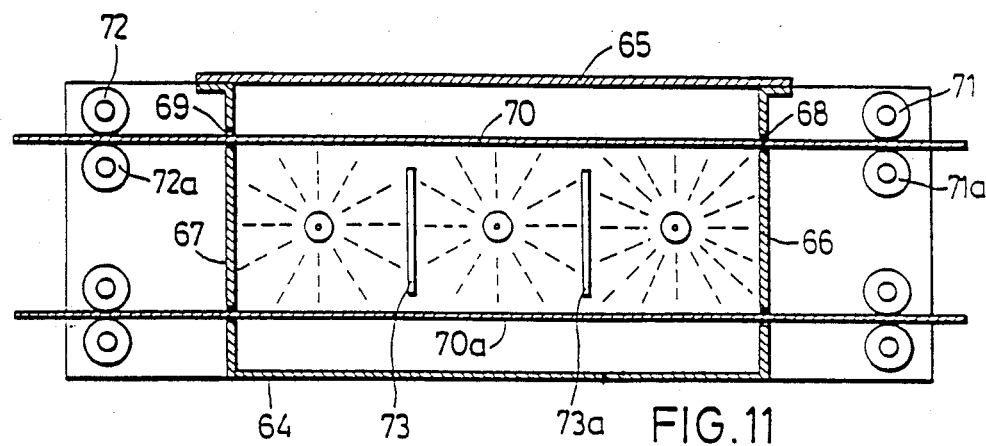
FIG. 11 is a vertical cross-sectional view of yet another coating apparatus in accordance with the invention.
Figure 12:
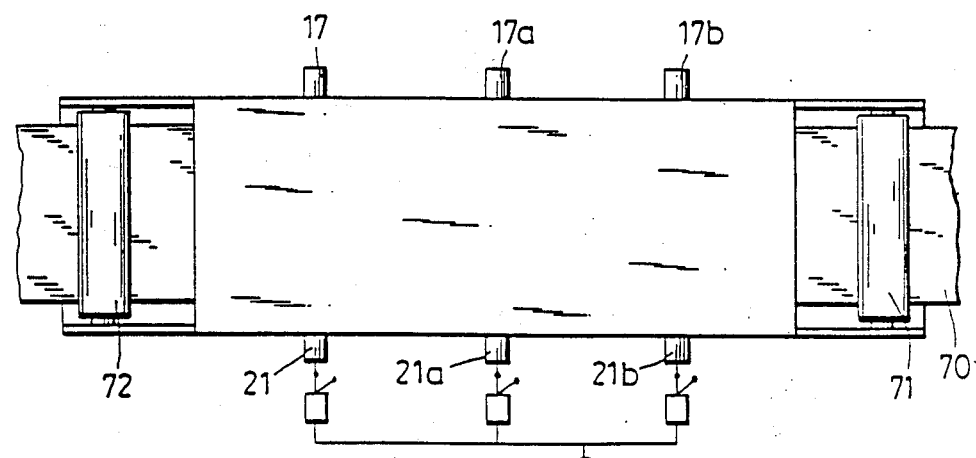
FIG. 12 is a top plan view of the apparatus in FIG. 11.

FIGS. 11 and 12 show an apparatus suitable to apply the inventive method to the coating of foils. In this vertical cross sectional view a box 64 with a cover 65 can be seen. Several cathodes 17, 17a, 17b and anodes 21, 21a, 21b are mounted on the opposite walls of the box. Walls 66 and 67 contain inlets and outlets for foils 70, 70a to be coated, which are moved by means of rolls 71, 71a and 72, 72a, respectively. Walls 73, 73a separate the discharges from each other. In addition, it is shown schematically, how a plurality of anodes can be operated simultaneously or, if desired, subsequently by opening or closing the switches connected to the anodes 21, 21a, 21b.

Example 1

To produce an aluminum coating, for example a mirror on a smooth plastic surface, the electrodes 17 and 21 were prepared in a way as can be seen from FIG. 4 and connected to a DC-power supply. The substrate to be coated was fixed on the support 37 and, by means of the pumping system 16 the evaporation apparatus 10 was pumped to a pressure of $10^{-4}$ mb. Prior to the coating process the substrate was carefully degreased and finally cleaned by a glow discharge ignited between the electrodes 38 and 39. For this purpose the valve 44 was opened to produce, while pumping, an argon gas pressure of about 0.1 mb in the evaporation chamber 10. After closing the valve 44 and pumping down the gas pressure to about $10^{-4}$ mb again; the electrode ends 25 and 30 were contacted briefly and pulled back into a predetermined position. Upon ignition of the vacuum arc discharge the characteristic cathode spots appeared on the cathode surface 30 and, within a moment, the aluminum 25 melted and the arc plasma, especially around the anode, turned into a blue-violet color. This color is typical for an aluminum vapor plasma and indicates the correct operation of the discharge in the evaporated anode material. If, for example, the arc was operated in copper or iron the arc plasma appeared in a green color, with chromium the plasma is blue-colored. Special care was taken to prevent molten metal droplets, generated at the cathode surface 30 during arc operation, from hitting the surface being coated. This was possible by a proper position of the cathode surface 30 within the shield 20. The arc current was 25 A, the voltage drop across the discharge was 35 V. Within 10 seconds the surface of the plastic substrate, placed 20 cm apart from the anode 25, was covered with a homogeneous, pinhole-free and mirror-like aluminum coating. The obtained coating was about $0.2\mu$ thick and showed an excellent adhesion.

OTHER EXAMPLES

A great variety of materials could be evaporated by the inventive method which preferably is suitable for evaporating metals. Among these are Al, Si, Ti, V, Cr, Mn, Fe, Co, Ni, Cu, Zn, Pd, Ag, Cd, and Au. Generally, materials with a high vapor pressure require higher arc currents than those having a low vapor pressure. For example, to operate the discharge with Cd an arc current of 10 A was sufficient while, for Ti or Pt, an arc current of more than 35 A is advisable.

To obtain reactive vapor depositions, for example TiN, the arc discharge was operated in an ambient $N_2$-atmosphere at about $10^{-2}$ mb.

It will be understood that each of the elements described above, or two or more together, may also find a useful application in other types of methods of and apparatus for evaporating materials in vacuum evaporator chambers differing from the types described above.

While the invention has been illustrated and described as embodied in a method of and apparatus for evaporating materials in a vacuum evaporator chamber, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A method of coating comprising exposing a substrate to be coated in a vacuum chamber to vapors produced with an electric arc discharge, the steps of said method including:
   (1) arranging in a single vacuum chamber the substrate to be coated, a cold cathode and an anode spaced from said substrate;
   (2) employing as the anode, a main anode body of refractory material and a vaporizable anode material supported at the end of the main anode body facing said cathode;
   (3) maintaining a vacuum in said chamber to the degree that only a vacuum arc discharge from the cathode to the anode can be maintained;
   (4) initiating an arc discharge between said cathode and said vaporizable anode material to produce cathode spots from which electrons travel to the anode to produce an arc current;
   (5) with space maintained between said cathode and anode, and in the absence of a discharge-sustaining gas in the path between said cathode and anode, maintaining a stable DC arc discharge between said cathode and anode for an extended duration by:
   (5a) continuously applying an arc-producing DC voltage between said cathode and anode for an extended duration, and
   (5b) maintaining the arc current low, but at a level sufficient to maintain a fixed region of anode material in a continuous evaporating state such that vapors of anode material from said fixed region continuously sustain said arc discharge, whereby ionized vapors of anode material from the resulting fixed anode region are continuously provided over a prolonged period; and
   (6) exposing said substrate to be coated to said ionized vapors during said prolonged period to produce a homogeneous, adherent coating on said substrate.

2. The method of claim 1 including maintaining said substrate to be coated at a negative potential with respect to said anode.

3. The method of claim 1 wherein the conditions of the arc are maintained to cause self-focusing of the electrons upon said fixed region.

4. The method of claim 1 including shielding said cathode from said substrate being coated.

5. The method of claim 1 including maintaining the voltage of said arc discharge at less than 100 V.

6. The method of claim 1 including maintaining across said arc discharge a voltage between 30 and 40 V.

7. The method of claim 5 or 6 wherein the current of said arc discharge is 10 A or greater.

8. The method of claim 1 including, during said arc discharge, replacing consumed anode material to enable prolongation of the coating of the substrate.

9. The method of claim 1 including utilizing a plurality of anodes comprised of the same coating material to effect simultaneous vapor deposition.

10. The method of claim 1 including utilizing a plurality of anodes comprised of different coating materials to effect simultaneous vapor deposition.

11. The method of claim 1 including moving said cathode and anode producing said arc discharge relative to the substrate being coated.

12. The method of claim 1 including maintaining in the evaporation chamber a reactive gas as residual gas.

13. The method of claim 1 including maintaining in the evaporation chamber a mixture of gases as residual gas.

14. An apparatus for coating a substrate in a vacuum chamber by exposure to vapors produced with an electric arc discharge, comprising:
(1) a single vacuum chamber having therein a support for a substrate to be coated, a cold cathode and an anode spaced from said substrate and said cathode;
(2) said anode comprising a main anode body of refractory material and a vaporizable anode material supported at the end of the main anode body facing said cathode;
(3) means for maintaining a vacuum in said chamber to the degree that only a vacuum arc discharge from the cathode to the anode can be maintained;
(4) means for initiating an arc discharge between said cathode and said vaporizable anode material to produce cathode spots from which electrons travel to the anode to produce an arc current;
(5) means including a DC voltage source for maintaining a stable DC arc discharge between said spaced cathode and anode in the absence of a discharge-sustaining gas in the path between said cathode and anode, said means constructed and arranged to:
(5a) continuously apply said arc-producing DC voltage between said cathode and anode for an extended duration, and
(5b) maintain the arc current low, but at a level sufficient to maintain a fixed region of anode material in a continuous evaporating state such that vapors of anode material from said fixed region continuously sustain said arc discharge,
whereby ionized vapors of anode material from the resulting fixed anode region can be continuously provided over a prolonged period; and
said apparatus arranged to expose said substrate to be coated to said ionized vapors during said prolonged period to produce a homogeneous, adherent coating on said substrate.

15. The apparatus of claim 14 including means to maintain said substrate at a negative potential with respect to said anode.

16. The apparatus of claim 14 wherein said anode and cathode are each provided with a support and including means for cooling the supports of said anode and said cathode during sustaining of said discharge.

17. The apparatus of claim 14 including a shield surrounding said cathode to prevent bombardment of the substrate with droplets from said cathode.

18. The apparatus of claim 14 including means for replacing, during said arc discharge, the coating material being consumed at said anode to enable prolongation of the coating of said substrate.

19. The apparatus of claim 14 including a shutter provided between said cathode and said anode and substrate to be coated to prevent bombardment of said substrate with particles produced during ignition of said discharge.

20. The apparatus of claim 14 wherein said vacuum chamber is defined by the inner walls of a tube which form said substrate to be coated, and means to move said cathode and anode producing said arc discharge along said tube for coating said inner walls of said tube.

21. The apparatus of claim 14 including a plurality of anodes comprised of the same coating material arranged to operate simultaneously.

22. The apparatus of claim 14 including a plurality of anodes comprised of different metals to produce a coating that comprises an with alloy.

23. The apparatus of claim 14 including oppositely disposed magnetic field coils for generating a magnetic field in said evaporation chamber to influence the path of charge carriers in said discharge.

* * * * *